United States Patent
Kuriki et al.

(10) Patent No.: US 9,406,858 B2
(45) Date of Patent: Aug. 2, 2016

(54) LED MODULE

(71) Applicants: CITIZEN ELECTRONICS CO., LTD., Fujiyoshida-shi, Yamanashi (JP); EYE LIGHTING SYSTEMS CORPORATION, Chuo-ku, Tokyo (JP)

(72) Inventors: Shingo Kuriki, Fujiyoshida (JP); Arata Shimozawa, Otsuki (JP); Nobuyuki Baba, Konosu (JP); Takahiro Mikami, Konosu (JP)

(73) Assignees: CITIZEN ELECTRONICS CO., LTD., Yamanashi (JP); EYE LIGHTING SYSTEMS CORPORATION, Tokyo (JP)

( * ) Notice: Subject to any disclaimer, the term of this patent is extended or adjusted under 35 U.S.C. 154(b) by 0 days.

(21) Appl. No.: 14/807,164

(22) Filed: Jul. 23, 2015

(65) Prior Publication Data

US 2016/0027981 A1    Jan. 28, 2016

(30) Foreign Application Priority Data

Jul. 25, 2014    (JP) .................................. 2014-152381

(51) Int. Cl.
| | | |
|---|---|---|
| H01L 21/00 | (2006.01) | |
| H01L 33/62 | (2010.01) | |
| H01L 27/15 | (2006.01) | |

(52) U.S. Cl.
CPC .............. *H01L 33/62* (2013.01); *H01L 27/156* (2013.01)

(58) Field of Classification Search
CPC ................ H01L 25/0753; H01L 33/54; H01L 2224/48091; H01L 2924/181; H01L 2224/73265; H01L 2924/00014; H01L 2924/00012; H05K 2201/10106
USPC .......................................... 257/87, 88, 97, 99
See application file for complete search history.

(56) References Cited

U.S. PATENT DOCUMENTS

| | | | |
|---|---|---|---|
| 8,018,151 B2 | 9/2011 | Chung et al. | |
| 2012/0187865 A1* | 7/2012 | Chung ............... | H05B 33/0827 315/294 |
| 2013/0076239 A1* | 3/2013 | Chung ................... | A01G 7/045 315/76 |
| 2014/0098529 A1* | 4/2014 | Hata ..................... | H05K 1/0274 362/231 |
| 2015/0061513 A1* | 3/2015 | Chung ............... | H05B 33/0806 315/185 R |

FOREIGN PATENT DOCUMENTS

JP            2011-49516 A       3/2011

* cited by examiner

*Primary Examiner* — Dung Le
(74) *Attorney, Agent, or Firm* — Ratnerprestia (57) ABSTRACT

An object is to provide an LED module that eliminates the need for providing electrodes between each device and allows LEDs to be arrayed with high density. An LED module includes a substrate, a first frame member, a second frame member disposed outside the first frame member, a plurality of LEDs for producing white light disposed within the first frame member, a phosphor resin disposed within the first frame member, a plurality of LEDs for producing colored light disposed between the first frame member and the second frame member, and electrodes for applying a voltage to the plurality of LEDs for producing the white light, wherein a metal wire to connect the plurality of LEDs for producing the colored light to one another is disposed so as to straddle a part of each of the electrodes.

6 Claims, 6 Drawing Sheets

LED MODULE

CROSS-REFERENCE TO RELATED APPLICATIONS

This application is a new U.S. patent application that claims benefit of JP 2014-152381, filed on Jul. 25, 2014, the entire content of JP 2014-152381 is hereby incorporated by reference.

TECHNICAL FILED

The present invention relates to an LED module, and more specifically relates to an LED module that can emit white light and light of full colors by itself.

BACKGROUND OF THE INVENTION

LEDs, i.e., semiconductor devices that are compact in size and emit light of bright colors with high luminous efficiency, as well as having a long life and high drive performance, are becoming widely used in recent years for lighting and the like.

An LED module is known in which blue LEDs and a phosphor resin layer to emit yellow light of 3500K are disposed inside, and blue LEDs and a phosphor resin layer to emit white light of 6500K are disposed outside. The LED module mixes the yellow light and the white light (see Japanese Patent Application Laid-Open No. 2011-49516, for example).

SUMMARY OF THE INVENTION

However, since the LEDs are bonded separately to respective electrodes with wire, the electrodes are each required to be disposed between the devices. Furthermore, the electrodes, each disposed between the devices, hinder the LEDs from being arrayed with high density.

An object of the present invention is to provide an LED module that can solve the problems described above.

Another object of the present invention is to provide an LED module that can eliminate the need for providing the electrodes between each device and allow LEDs to be arrayed with high density.

Yet another object of the present invention is to provide an LED module that can emit white light and light of full colors, while eliminating the need for providing the electrodes between each device and allowing LEDs to be arrayed with high density.

An LED module includes a substrate, a first frame member, a second frame member disposed outside the first frame member, a plurality of LEDs for producing white light disposed within the first frame member and on the substrate, a phosphor resin disposed within the first frame member to protect the plurality of LEDs for producing white light, a plurality of LEDs for producing colored light disposed between the first frame member and the second frame member and on the substrate, and electrodes for applying a voltage to the plurality of LEDs for producing white light, wherein a part of each of the electrodes is disposed between the first frame member and the second frame member, and wherein metal wire for connecting the plurality of LEDs for producing the colored light to one another is disposed in such a manner as to straddle the parts of the electrodes disposed between the first frame member and the second frame member.

In the above LED module, it is preferable that the plurality of LEDs for producing colored light include red LEDs, green LEDs, and blue LEDs, that the LED module further include red electrodes for applying a voltage to the red LEDs, green electrodes for applying a voltage to the green LEDs, and blue electrodes for applying a voltage to the blue LEDs, and that a red metal wire for connecting the red LEDs to one another be disposed in such a manner as to straddle the green electrodes and the blue electrodes.

In the above LED module, the red metal wire is preferably disposed in such a manner as to straddle the green electrodes and the blue electrodes via metal bumps.

In the above LED module, a resist resin for protection is preferably disposed between the red metal wire and the green electrode and between the red metal wire and the blue electrode.

In the above LED module, it is preferable that the first frame member and the second frame member be concentrically disposed on the substrate.

In the above LED module, it is preferable that another part of each of the electrodes for applying the voltage to the plurality of LEDs for producing the white light be disposed under the first frame member, and the plurality of LEDs for producing the white light be connected to the parts of the electrodes disposed under the first frame member by metal wire.

According to the LED module described above, the two frame members form the inner and outer mounting areas, and the electrodes for applying the voltage to the LEDs disposed in the inner mounting area are disposed under the inner frame member, thus eliminating the need for providing other electrodes between each device. Therefore, the LEDs can be arrayed with high density in the above LED module.

BRIEF DESCRIPTION OF THE DRAWINGS

Other features and advantages of the present invention will be better understood based on the following detailed description, taken together with the drawings wherein.

DESCRIPTION

An LED module according to the present invention will be described below with reference to the drawings. It is noted that the technical scope of the present invention is not limited to the embodiments thereof, but extends to the invention described in the claims and equivalents thereof.

Figure 1A:
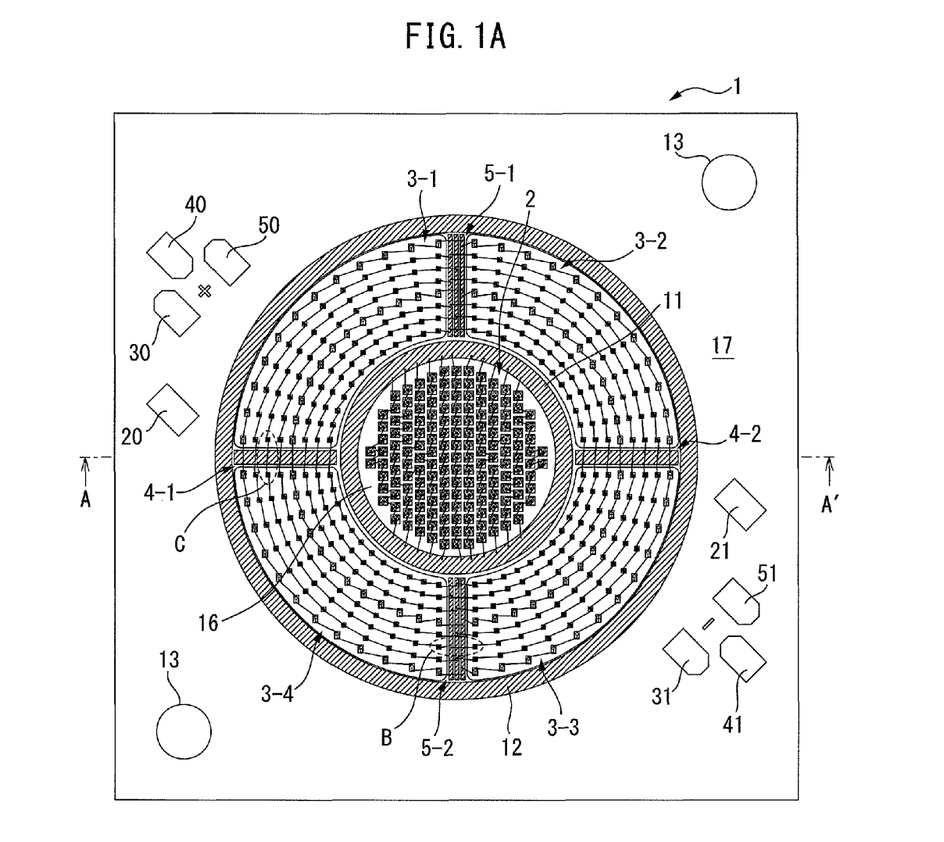
FIG. 1A is a top plan view of an LED module 1 according to the present invention.
Figure 1B:
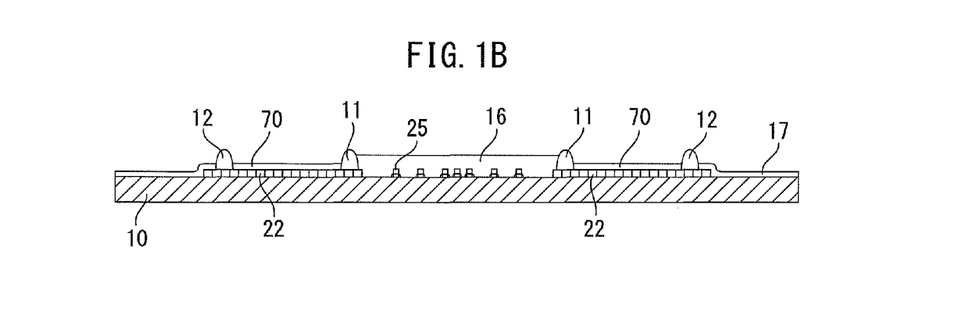
FIG. 1B is a cross-sectional view taken along the line AA' in FIG. 1A.

FIG. 1A is the top plan view of an LED module 1 according to the present invention, and FIG. 1B is the cross-sectional view taken along the line AA' in FIG. 1A.

The LED module 1 is constituted of an aluminum substrate 10, various electrodes, a first frame member 11, a second frame member 12, LEDs of various colors, a phosphor resin 16, and the like. The LED module 1 is attached to a lighting fixture or the like using guide holes 13 provided at its end portions.

As shown in FIG. 1A, the first frame member 11 and the second frame member 12 are concentrically disposed. A first mounting area 2 is provided within the first frame member 11. Second to fifth mounting areas 3-1 to 3-4 are provided outside the first frame member 11 and between the first frame member 11 and the second frame member 12. Each mounting area is an area provided on the aluminum substrate 10, to mount the LEDs of individual colors. In the mounting areas, the LEDs of individual colors are bonded directly onto the aluminum substrate 10 with a die bond.

First wiring areas 4-1 and 4-2 are provided between the fifth mounting area 3-4 and the second mounting area 3-1, and between the third mounting area 3-2 and the fourth mounting area 3-3, respectively. Second wiring areas 5-1 and 5-2 are provided between the second mounting area 3-1 and the third mounting area 3-2, and between the fourth mounting area 3-3 and the fifth mounting area 3-4, respectively.

In the first mounting area 2, a plurality of blue LEDs 25 for producing white light are arrayed. The plurality of blue LEDs 25 are bonded directly onto the aluminum substrate 10 with the die bond.

The inside of the first frame member 11 is filled with the phosphor resin 16 to protect the blue LEDs 25. As the phosphor resin 16, a translucent epoxy resin or silicone resin is usable. The phosphor resin 16 contains a phosphor mixed in the resin. The phosphor absorbs a part of blue light emitted from the blue LEDs 25 and emits yellow light produced by wavelength conversion of the blue light, so that white light is emitted from the inside of the first frame member 11 as a mixture of the blue light and the yellow light. Note that, the phosphor resin 16 may contain a diffusing material to uniformly diffuse the light emitted from the blue LEDs 25.

A plurality of green LEDs 35, a plurality of red LEDs 45, and a plurality of blue LEDs 55 for producing colored light are arrayed in the second to fifth mounting areas 3-1 to 3-4. The plurality of green LEDs 35, the plurality of red LEDs 45, and the plurality of blue LEDs 55 are bonded directly onto the aluminum substrate 10 with the die bond.

A protective layer 70 is formed between the first frame member 11 and the second frame member 12 to protect the plurality of green LEDs 35, the plurality of red LEDs 45, and the plurality of blue LEDs 55. As the protective layer 70, a translucent epoxy resin or silicone resin is usable. Monochromatic light of each individual color by each of the plurality of green LEDs 35, the plurality of red LEDs 45, and the plurality of blue LEDs 55, and colored light, i.e., a mixture of the monochromatic light can be emitted from the second to fifth mounting areas 3-1 to 3-4.

An anode electrode 20 and a cathode electrode 21 are disposed outside the second frame member 12 to apply a voltage to the blue LEDs 25 arrayed in the first mounting area 2. An anode electrode 30 and a cathode electrode 31 are also disposed outside the second frame member 12 to apply a voltage to the green LEDs 35 arrayed in the second to fifth mounting areas 3-1 to 3-4. An anode electrode 40 and a cathode electrode 41 are also disposed outside the second frame member 12 to apply a voltage to the red LEDs 45 arrayed in the second to fifth mounting areas 3-1 to 3-4. Furthermore, an anode electrode 50 and a cathode electrode 51 are disposed outside the second frame member 12 to apply a voltage to the blue LEDs 55 arrayed in the second to fifth mounting areas 3-1 to 3-4.

A resist layer 17 is applied to the circumference of the second frame member 12 except the portions of the anode electrodes and the cathode electrodes for the LEDs of individual colors. In the LED module 1, the control for the white light and the colored light can be performed independently by applying different voltages to each pair of the anode and cathode electrodes for the LEDs of each individual color.

Figure 2:
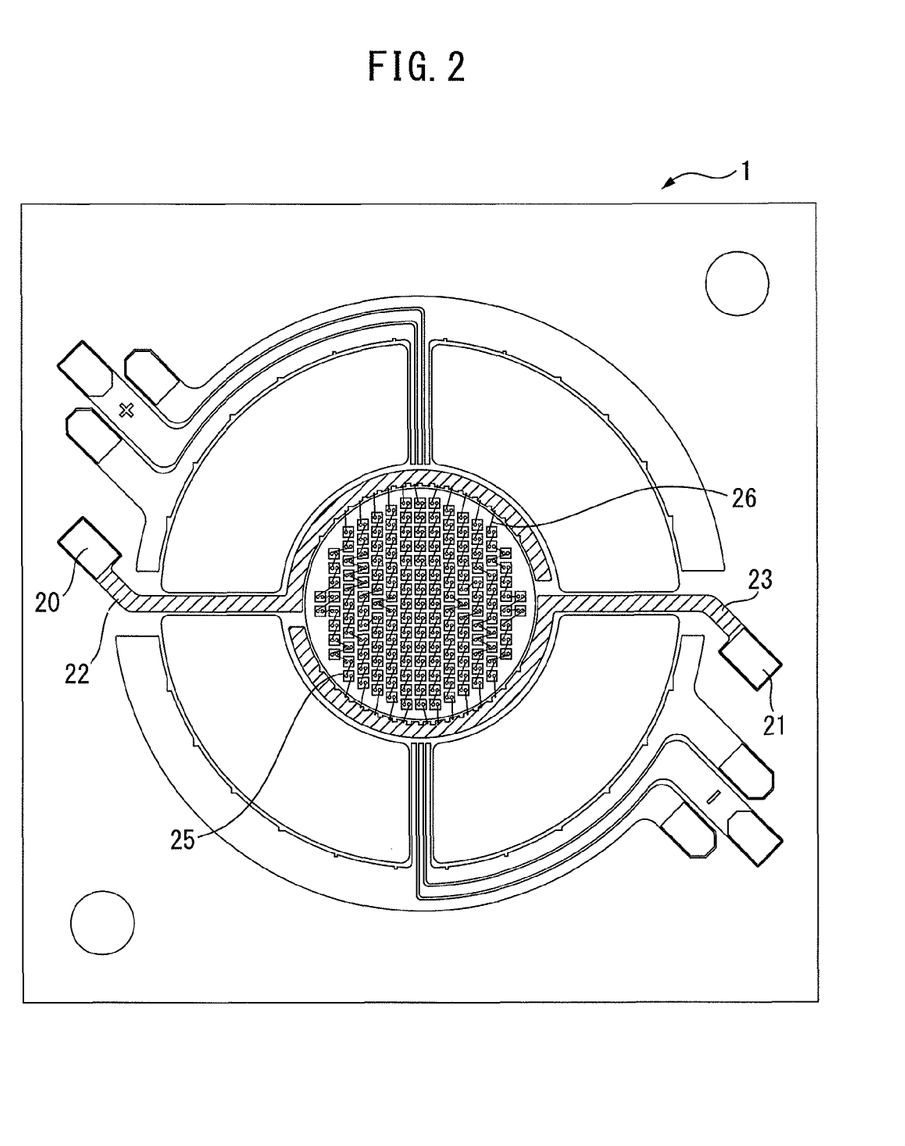
FIG. 2 is a drawing for explaining electrodes for blue LEDs for producing white light arrayed in a first mounting area 2.

FIG. 2 is the drawing that explains electrodes for the blue LEDs for producing the white light arrayed in the first mounting area 2.

The anode electrode 20 is connected to an electrode 22 that passes through the first wiring area 4-1 and is disposed along the first mounting area 2 under the first frame member 11. The cathode electrode 21 is connected to an electrode 23 that passes through the first wiring area 4-2 and is disposed under the first frame member 11 so as to be opposite to the electrode 22 across the first mounting area 2. The blue LEDs 25 for producing the white light are divided into eleven groups each of which includes fifteen of the blue LEDs 25 connected in series by metal wire 26. The eleven groups of the fifteen blue LEDs 25 for producing the white light are connected in parallel between the electrodes 22 and 23. All of the blue LEDs 25 for producing the white light are turned on by applying a voltage of 15×Vfw (a forward voltage of the blue LED for producing the white light) or more between the anode electrode 20 and the cathode electrode 21.

Since the electrodes 22 and 23 to apply the voltage to the blue LEDs 25 for producing the white light are disposed under the first frame member 11, it is possible to eliminate the need for providing other electrodes for use in wire bonding to the respective blue LEDs 25 for producing the white light. Therefore, the blue LEDs 25 for producing the white light can be arrayed within the first mounting area 2 with high density.

Figure 3:
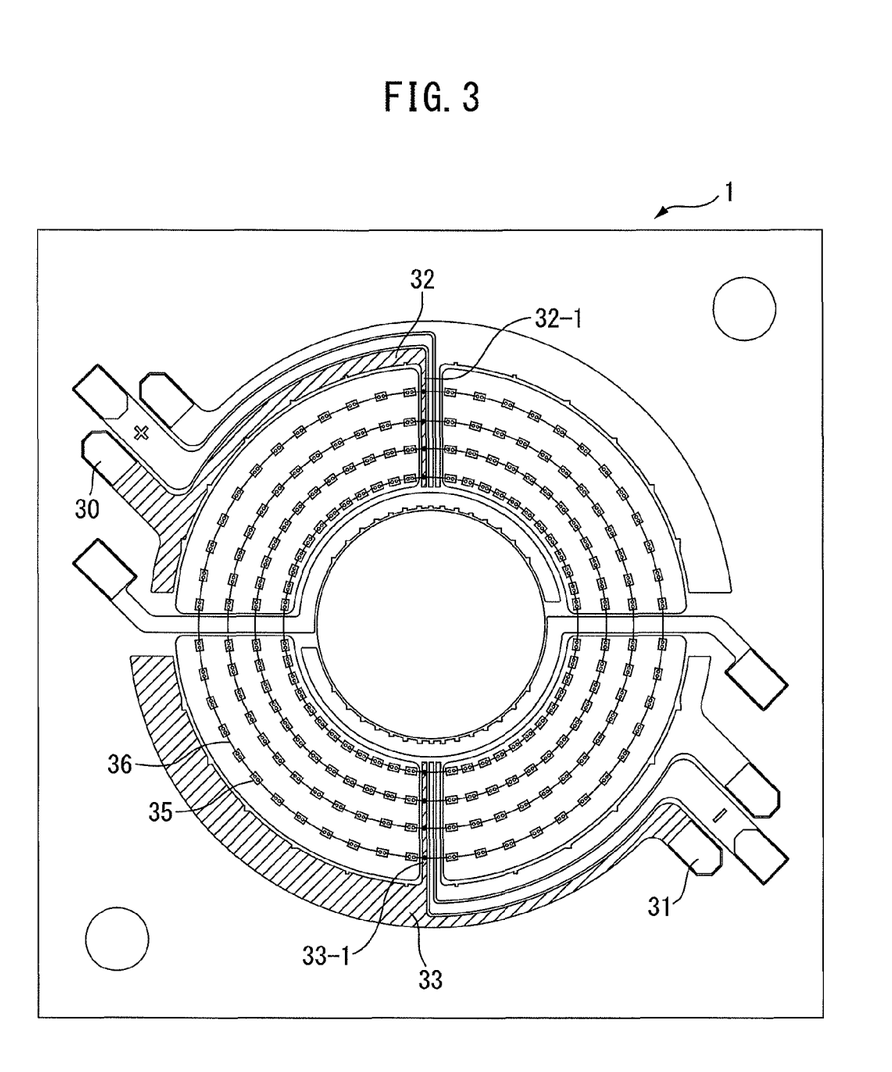
FIG. 3 is a drawing for explaining electrodes for green LEDs arrayed in second to fifth mounting areas 3-1 to 3-4.

FIG. 3 is the drawing that explains electrodes for the green LEDs arrayed in the second to fifth mounting areas 3-1 to 3-4.

The anode electrode 30 is connected to an electrode 32 disposed along the second mounting area 3-1, and the cathode electrode 31 is connected to an electrode 33 disposed along the fourth and fifth mounting areas 3-3 and 3-4. The electrode 32 includes a narrow electrode 32-1 disposed in the second wiring area 5-1. Similarly, the electrode 33 includes a narrow electrode 33-1 disposed in the second wiring area 5-2.

The green LEDs 35 are divided into eight groups each of which includes twenty-four of the green LEDs 35 connected in series by metal wire 36. The eight groups of the twenty-four green LEDs 35 are connected in parallel between the narrow electrodes 32-1 and 33-1. All the green LEDs 35 are turned on by applying a voltage of 24×Vfg (a forward voltage of the green LED) or more between the anode electrode 30 and the cathode electrode 31.

Figure 4:
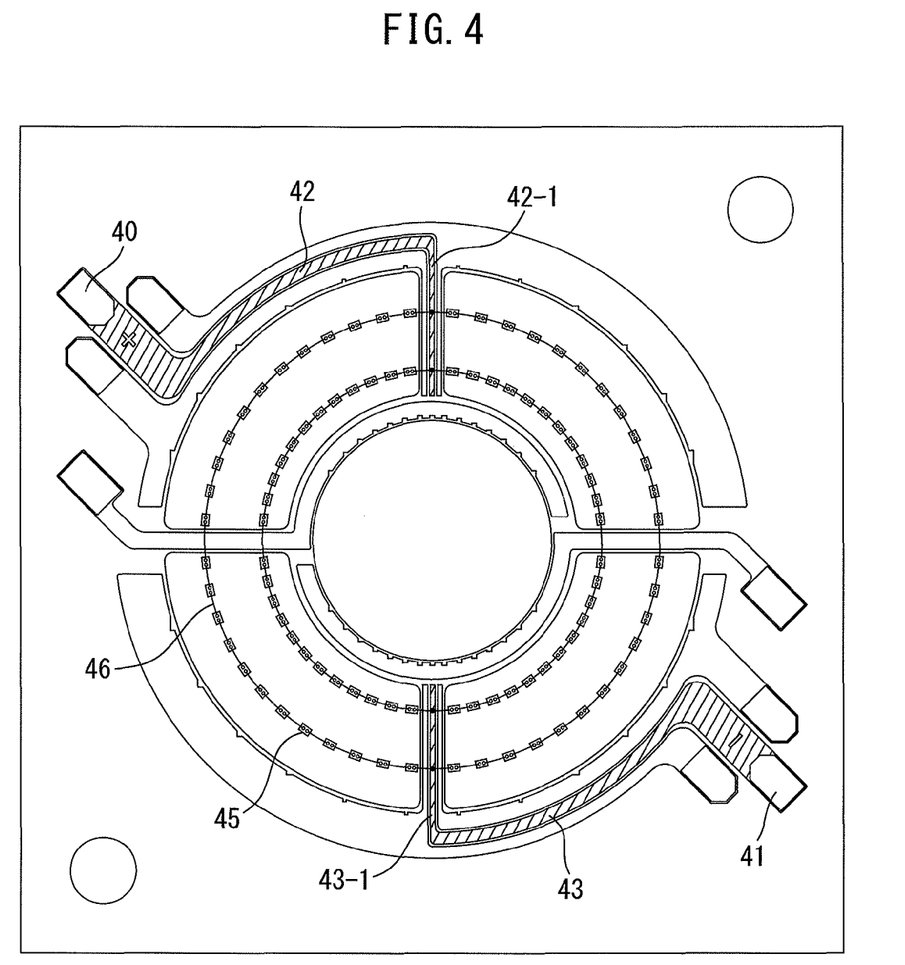
FIG. 4 is a drawing for explaining electrodes for red LEDs arrayed in the second to fifth mounting areas 3-1 to 3-4.

FIG. 4 is the drawing that explains electrodes for the red LEDs arrayed in the second to fifth mounting areas 3-1 to 3-4.

The anode electrode 40 is connected to an electrode 42 disposed along the second mounting area 3-1, and the cathode electrode 41 is connected to an electrode 43 disposed along the fourth mounting area 3-3. The electrode 42 includes a narrow electrode 42-1 disposed in the second wiring area 5-1. Similarly, the electrode 43 includes a narrow electrode 43-1 disposed in the second wiring area 5-2.

The red LEDs 45 are divided into four groups each of which includes twenty-four of the red LEDs 45 connected in series by metal wire 46. The four groups of the twenty-four red LEDs 45 are connected in parallel between the narrow electrodes 42-1 and 43-1. All the red LEDs 45 are turned on by applying a voltage of 24×Vfr (a forward voltage of the red LED) or more between the anode electrode 40 and the cathode electrode 41.

Figure 5:
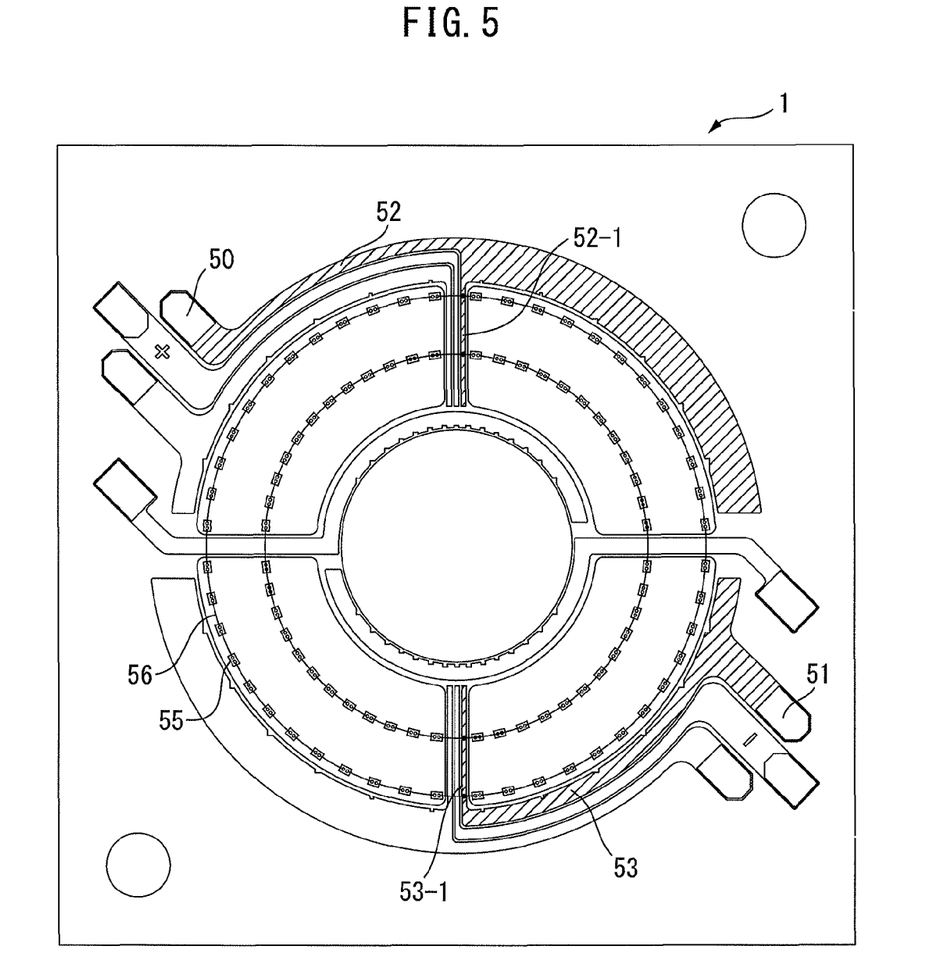
FIG. 5 is a drawing for explaining electrodes for blue LEDs arrayed in the second to fifth mounting areas 3-1 to 3-4.

FIG. 5 is the drawing that explains electrodes for the blue LEDs arrayed in the second to fifth mounting areas 3-1 to 3-4.

The anode electrode 50 is connected to an electrode 52 disposed along the second and third mounting areas 3-1 and 3-2, and the cathode electrode 51 is connected to an electrode 53 disposed along the fourth mounting area 3-3. The electrode 52 includes a narrow electrode 52-1 disposed in the second wiring area 5-1. Similarly, the electrode 53 includes a narrow electrode 53-1 disposed in the second wiring area 5-2.

The blue LEDs 55 are divided into four groups each of which includes twenty-four of the blue LEDs 55 connected in series by metal wire 56. The four groups of the twenty-four blue LEDs 55 are connected in parallel between the narrow electrodes 52-1 and 53-1. All of the blue LEDs 55 are turned on by applying a voltage of 24×Vfb (a forward voltage of the blue LED) or more between the anode electrode 50 and the cathode electrode 51.

Figure 6A:
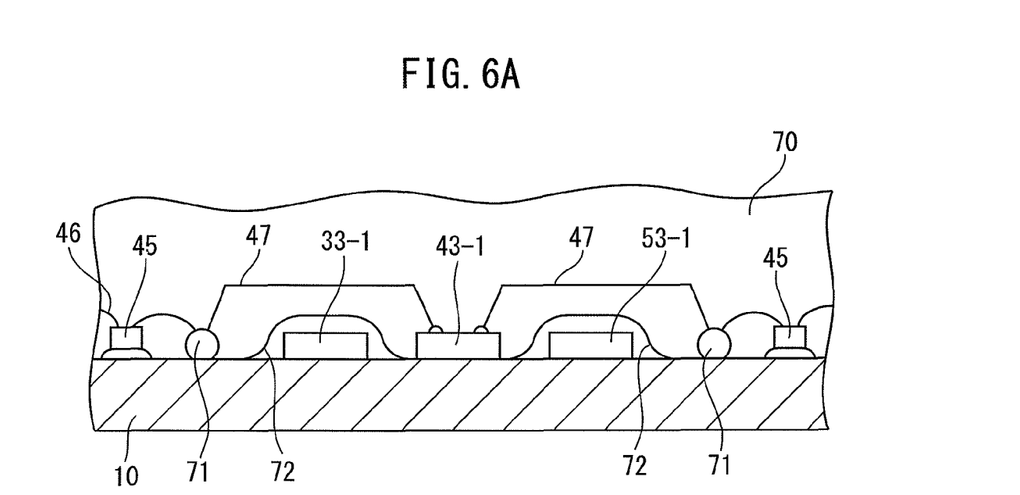
FIG. 6A is an enlarged view of a portion B shown in FIG. 1A.
Figure 6B:
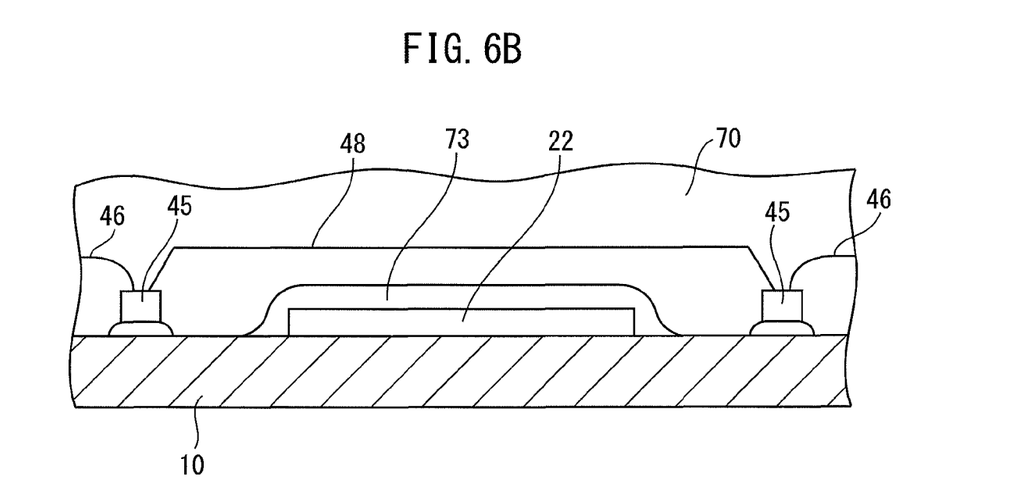
FIG. 6B is an enlarged view of a portion C shown in FIG. 1B.

FIG. 6A is the enlarged view of the portion B shown in FIG. 1A. FIG. 6B is the enlarged view of the portion C shown in FIG. 1A.

FIG. 6A shows the connection state of the red LEDs 45 shown in FIG. 4 to the narrow electrode 43-1 in the second wiring area 5-2. In the second wiring area 5-2, the left and right red LEDs 45 are each connected to the narrow electrode 43-1 by bent metal wire 47 in such a manner as to straddle the narrow electrode 33-1 for the green LEDs and the narrow electrode 53-1 for the blue LEDs, respectively.

In the second wiring area 5-2, metal bumps 71 are disposed on the left and right of the second wiring area 5-2 and in front of the red LEDs 45, in order to prevent the metal wire 47 from sagging. The metal wire 47 rises to a height of the metal bumps, and then straddles the narrow electrode 33-1 for the green LEDs and the narrow electrode 53-1 for the blue LEDs.

Furthermore, in the second wiring area 5-2, a resist resin 72 is applied between the narrow electrode 33-1 for the green LEDs and the metal wire 47 and between the narrow electrode 53-1 for the blue LEDs and the metal wire 47, to prevent short-circuits therebetween. In addition, the protective layer 70 is applied over the red LEDs 45, the metal wire 47, the metal bumps 71, and the resist resin 72 to protect each component.

FIG. 6A shows a case in which the metal wire 47 for connecting the red LEDs 45 straddles the narrow electrode 33-1 for the green LEDs and the narrow electrode 53-1 for the blue LEDs in the second wiring area 5-2. The same goes for a case in which metal wire for connecting the green LEDs 35 or metal wire for connecting the blue LEDs 55 straddles the narrow electrodes for the LEDs of the other colors.

FIG. 6B shows a state in which in the first wiring area 4-1, the metal wire for connecting the red LEDs 45, as shown in FIG. 4, straddles the electrode 22 for the blue LEDs 25 for producing the white light arrayed in the first mounting area 2. In the first wiring area 4-1, the red LEDs 45 are connected to each other by bent metal wire 48 in such a manner as to straddle the electrode 22.

Although the metal bumps 71 are used in the second wiring area 5-2 (see FIG. 6A), no meal bump is used in the first wiring area 4-1 because a resist resin 73 is applied between the metal wire 48 and the electrode 22. Note that, the protective layer 70 is applied over the red LEDs 45, the metal wire 48, and the resist resin 73 to protect each component.

FIG. 6B shows a case in which the metal wire 48 for connecting the red LEDs 45 straddles the electrode 22 for the blue LEDs 25 for producing the white light arrayed in the first mounting area 2, in the first wiring area 4-1. The same goes for a case in which the metal wire for connecting the green LEDs 35 or the metal wire for connecting the blue LEDs 55 straddles the electrode 22 for the blue LEDs 25 for producing the white light arrayed in the first mounting area 2.

The preceding description has been presented only to illustrate and describe exemplary embodiments of the present invention. It is not intended to be exhaustive or to limit the invention to any precise form disclosed. It will be understood by those skilled in the art that various changes may be made and equivalent may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

DESCRIPTION OF THE REFERENCE NUMERALS

1 . . . LED module
10 . . . aluminum substrate
11 . . . first frame member
12 . . . second frame member
16 . . . phosphor resin
20, 30, 40, 50 . . . anode electrode
21, 31, 41, 51 . . . cathode electrode
22, 23 . . . electrode for blue LEDs for producing white light
25 . . . blue LED for producing white light
32, 33 . . . electrode for green LEDs
35 . . . green LED
42, 43 . . . electrode for red LEDs
45 . . . red LED
52, 53 . . . electrode for blue LEDs
55 . . . blue LED

What is claimed is:

1. An LED module comprising:
a substrate;
a first frame member;
a second frame member disposed outside the first frame member;
a plurality of LEDs for producing white light disposed within the first frame member and on the substrate;
a phosphor resin disposed within the first frame member to protect the plurality of LEDs for producing the white light;
a plurality of LEDs for producing colored light disposed between the first frame member and the second frame member and on the substrate; and
electrodes for applying a voltage to the plurality of LEDs for producing white light,
wherein a part of each of the electrodes is disposed between the first frame member and the second frame member, and
wherein a metal wire for connecting the plurality of LEDs for producing the colored light to one another is disposed in such a manner as to straddle the parts of the electrodes disposed between the first frame member and the second frame member.

2. The LED module according to claim 1,
Wherein the plurality of LEDs for producing colored light include red LEDs, green LEDs, and blue LEDs,
further comprising red electrodes for applying a voltage to the red LEDs, green electrodes for applying a voltage to the green LEDs, and blue electrodes for applying a voltage to the blue LEDs, wherein the red metal wire for connecting the red LEDs to one another is disposed in such a manner as to straddle the green electrodes and the blue electrodes.

3. The LED module according to claim 1, wherein the red metal wire is disposed in such a manner as to straddle the green electrodes and the blue electrodes via metal bumps.

4. The LED module according to claim 2, wherein a resist resin for protection is disposed between the red metal wire and the green electrode and between the red metal wire and the blue electrode.

5. The LED module according to claim 1, wherein the first frame member and the second frame member are concentrically disposed on the substrate.

6. The LED module according to claim 1, wherein another part of each of the electrodes for applying the voltage to the plurality of LEDs for producing the white light is disposed under the first frame member, and the plurality of LEDs for producing the white light are connected to the parts of the electrodes disposed under the first frame member by the metal wire.

* * * * *